(12) United States Patent
Cho et al.

(10) Patent No.: US 12,272,862 B2
(45) Date of Patent: Apr. 8, 2025

(54) ANTENNA APPARATUS AND FABRICATION METHOD

(71) Applicant: Infineon Technologies AG, Neubiberg (DE)

(72) Inventors: Eung San Cho, Torrance, CA (US);
Ashutosh Baheti, Munich (DE);
Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/519,821

(22) Filed: Nov. 27, 2023

(65) Prior Publication Data

US 2024/0097313 A1   Mar. 21, 2024

Related U.S. Application Data

(62) Division of application No. 16/939,392, filed on Jul. 27, 2020, now Pat. No. 11,870,130.

(51) Int. Cl.
| | |
|---|---|
| *H01Q 1/22* | (2006.01) |
| *H01L 21/48* | (2006.01) |
| *H01L 23/498* | (2006.01) |
| *H01L 23/66* | (2006.01) |

(52) U.S. Cl.
CPC ........ *H01Q 1/2283* (2013.01); *H01L 21/4853* (2013.01); *H01L 21/4857* (2013.01); *H01L 21/486* (2013.01); *H01L 23/49816* (2013.01); *H01L 23/66* (2013.01); *H01L 2223/6677* (2013.01)

(58) Field of Classification Search
CPC ........ H01Q 1/22; H01Q 1/2283; H01Q 21/00; H01Q 21/0006; H01Q 21/0025; H01Q 23/00; H01L 23/49822; H01L 21/4853; H01L 21/486; H01L 23/49816; H01L 21/4857; H01L 2223/667793
See application file for complete search history.

(56) References Cited

U.S. PATENT DOCUMENTS

| | | | |
|---|---|---|---|
| 2009/0289343 A1* | 11/2009 | Chiu | H01L 23/3128 257/690 |
| 2009/0302437 A1* | 12/2009 | Kim | H01L 21/561 257/E23.18 |
| 2012/0062439 A1* | 3/2012 | Liao | H01L 23/481 29/25.01 |
| 2012/0280860 A1* | 11/2012 | Kamgaing | H01L 23/66 29/601 |
| 2016/0087333 A1* | 3/2016 | Tong | H01Q 9/0407 343/873 |
| 2020/0118949 A1 | 4/2020 | Moallem et al. | |
| 2021/0242896 A1* | 8/2021 | Kim | H01L 23/66 |
| 2021/0257716 A1* | 8/2021 | Baheti | H01L 23/3128 |

* cited by examiner

*Primary Examiner* — Thai Pham
(74) *Attorney, Agent, or Firm* — Slater Matsil, LLP

(57) ABSTRACT

A semiconductor device includes a semiconductor die comprising a radio frequency (RF) circuit, a first dielectric layer disposed over a first surface of the semiconductor die, an antenna layer disposed over a surface of the first dielectric layer, and an antenna feeding structure coupling the antenna layer to the RF circuit of the semiconductor die, wherein the semiconductor die comprises a via, and the antenna feeding structure comprises a first portion arranged within the opening of the semiconductor die and extending to the first surface of the semiconductor die, and a second portion arranged through the first dielectric layer.

22 Claims, 21 Drawing Sheets

ANTENNA APPARATUS AND FABRICATION METHOD

This application is a divisional of U.S. patent application Ser. No. 16/939,392, filed Jul. 27, 2020, which application is hereby incorporated herein by reference.

TECHNICAL FIELD

The present invention relates generally to radio frequency semiconductor devices, and in particular embodiments, to antenna-in-package semiconductor devices.

BACKGROUND

Since the invention of the integrated circuit, the semiconductor industry has experienced rapid growth due to continuous improvements in the integration density of various electronic components. The improvement in integration density has come from continuous reductions in minimum feature size. The reduced feature size allows more components to be integrated into a given semiconductor area. As the demand for further reducing the size of the electronic device has grown recently, there has grown a need for more creative packaging techniques of semiconductor dies.

As semiconductor technologies evolve, fan-out wafer-level packaging has emerged as an effective alternative to further reduce the physical size of a semiconductor chip. In a semiconductor device having a fan-out signal routing layout, the input and output pads of a semiconductor die can be redistributed to an area outside the area under the semiconductor die. As such, the input and output pads can spread signals to a larger area than the area under the semiconductor die and provide additional space for interconnects. As a result of having the fan-out signal routing layout, the number of input and output pads of the semiconductor device can be increased.

In a fan-out wafer-level package, the semiconductor die may comprise radio-frequency integrated circuits (RFICs). An example of such a semiconductor device is an antenna-in-package (AiP) device. The AiP device includes an RFIC and an antenna. The RFIC and the antenna are included in a same package. The AiP device allows integration of RF components (e.g., an antenna) with active circuits (e.g., RFIC) into a same module. The AiP device is able to reduce the footprint of a radio frequency semiconductor device.

In some high frequency applications such as RFICs operating at millimeter wave frequencies, a variety of challenges exist. For example, the limiting factors for further reducing the size of the AiP device may come from how to route the antenna feeding structure so as to better isolate and/or shield the feedline and antenna layer. It is desirable to have new AiP structures to further improve the performance of the RFICs.

SUMMARY

In accordance with an embodiment, a semiconductor device comprises a semiconductor die comprising a radio frequency (RF) circuit, a first dielectric layer disposed over a first surface of the semiconductor die, an antenna layer disposed over a surface of the first dielectric layer, and an antenna feeding structure coupling the antenna layer to the RF circuit of the semiconductor die, wherein the semiconductor die comprises a via, and the antenna feeding structure comprises a first portion arranged within the opening of the semiconductor die and extending to the first surface of the semiconductor die, and a second portion arranged through the first dielectric layer.

In accordance with another embodiment, a method comprises forming a via in a semiconductor die comprising a radio frequency (RF) circuit, depositing a first dielectric layer over a first surface of the semiconductor die, forming a first via in the first dielectric layer, and forming an antenna layer on a first surface of the first dielectric layer, wherein an antenna feeding structure is configured to couple the RF circuit to the antenna layer, and wherein the antenna feeding structure comprises a first portion formed by the via of the semiconductor die and extending to the first surface of the semiconductor die, and a second portion formed by in the first via.

In accordance with yet another embodiment, a system comprises a semiconductor die comprising a via and a radio frequency (RF) circuit, a first dielectric layer disposed over a first surface of the semiconductor die, an antenna layer disposed over a surface of the first dielectric layer, and an antenna feeding structure comprising a first portion formed by the via of the semiconductor die, and a second portion within the first dielectric layer, wherein the antenna layer is coupled to the RF circuit of the semiconductor die through the antenna feeding structure.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF THE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an antenna-in-package semiconductor device. The present disclosure may also be applied, however, to a variety of radio frequency semiconductor devices. Hereinafter, various embodiments will be explained in detail with reference to the accompanying drawings.

Figure 1:
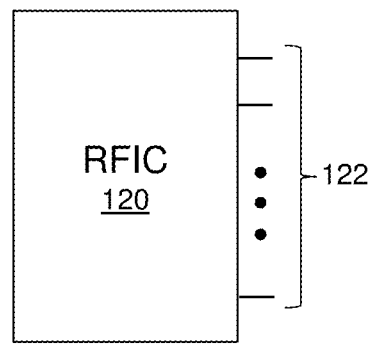
FIG. 1 illustrates a block diagram of a radio frequency semiconductor device in accordance with various embodiments of the present disclosure.

FIG. 1 illustrates a block diagram of a radio frequency semiconductor device in accordance with various embodiments of the present disclosure. The radio frequency semiconductor device 120 comprises a radio frequency integrated circuit (RFIC). For simplicity, the functional blocks of the radio frequency semiconductor device 120 are not illustrated in FIG. 1. A person skilled in the art would understand the radio frequency semiconductor device 120 may comprise a variety of functional blocks such as a baseband processor, a transmitter, a receiver and the like. Throughout the description, the radio frequency semiconductor device 120 may be alternatively referred to as a RFIC 120.

The radio frequency semiconductor device 120 comprises various active circuits. The radio frequency semiconductor device 120 is implemented on a semiconductor die (shown in FIG. 2). The active circuits (e.g., RFIC) are formed adjacent to a second side of the semiconductor die. The side for instance corresponds to a front side of the semiconductor die. A first side of the semiconductor die is known as a backside of the semiconductor die. The front side and the backside are two opposite sides of the semiconductor die.

As shown in FIG. 1, the radio frequency semiconductor device 120 comprises a plurality of input/output pads 122. The input/output pads 122 are employed to electrically couple the RFIC to external circuits. In some embodiments, the input/output pads 122 are placed adjacent to the front side of the semiconductor die. A plurality of conductive features may be formed on the backside of the semiconductor die. Furthermore, a plurality of vias may be formed in the semiconductor die. The RFIC may be electrically coupled to the conductive feature through at least one of the plurality of vias. The detailed structure of the radio frequency semiconductor device 120 will be described below with respect to FIG. 2.

The radio frequency semiconductor device 120 may be integrated into a package along with a plurality of antenna structures (e.g., antenna layers). A semiconductor package including both RFIC and the antenna structures is known as an antenna-in-package (AiP) device. The detailed structure of the AiP device will be described below with respect to FIGS. 2-10.

Figure 2:
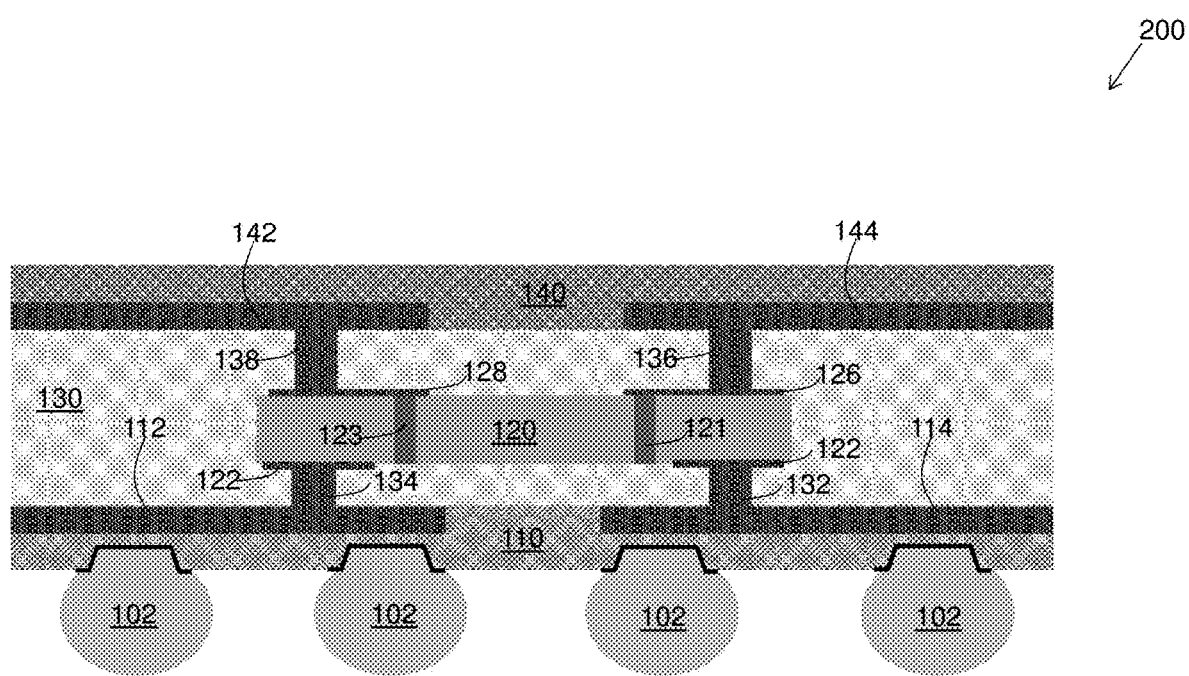
FIG. 2 illustrates a cross sectional view of a first implementation of an AiP device including the radio frequency semiconductor device shown in FIG. 1 in accordance with various embodiments of the present disclosure.

FIG. 2 illustrates a cross sectional view of a first implementation of an AiP device including the radio frequency semiconductor device shown in FIG. 1 in accordance with various embodiments of the present disclosure. The AiP device 200 is also referred to generically as a semiconductor device 200. The AiP device 200 comprises the radio frequency semiconductor device 120 embedded in a first dielectric layer 130. In some embodiments, the first dielectric layer 130 is formed of suitable dielectric materials such as epoxy resin, glass fiber (e.g., pre-preg), mold compound materials and the like. In some embodiments, the first dielectric layer may be implemented as a molding compound layer. As shown in FIG. 2, the radio frequency semiconductor device 120 is formed in a semiconductor die. Throughout the description, the radio frequency semiconductor device 120 may be alternatively referred to as a semiconductor die 120.

The semiconductor die 120 comprises a plurality of input/output pads 122 formed on a second side of the semiconductor die 120, and conductive features 126 and 128 formed on a first side of the semiconductor die 120. As described above with respect to FIG. 1, the second side of the semiconductor die 120 is a front side of the semiconductor die. The first side of the semiconductor die 120 is a backside of the semiconductor die. The semiconductor die 120 further comprises a plurality of vias 121 and 123 arranged therethrough. The vias 121, 123 are formed using corresponding openings arranged in the semiconductor die 120. As shown in FIG. 2, the vias 121 and 123 extends from the backside to the front side of the semiconductor die 120. In alternative embodiments, the vias 121, 123 may be blind vias that extend to the backside (first side) of the semiconductor die 120, the openings being correspondingly blind openings arranged in the backside of the semiconductor die 120.

It should be noted that FIG. 2 illustrates only two input/output pads of the semiconductor die 120 that may include a large number, e.g. hundreds, of such input/output pads. The number of input/output pads illustrated herein is limited solely for the purpose of clearly illustrating the inventive aspects of the various embodiments. The present disclosure is not limited to any specific number of input/output pads. Likewise, the number of the vias (e.g., vias 121 and 123) of the semiconductor die 120 illustrated herein is limited solely for the purpose of clearly illustrating the inventive aspects of the various embodiments. Furthermore, while FIG. 2 illustrates the semiconductor die 120 with two conductive features 126 and 128, the semiconductor die 120 could accommodate any number of conductive features.

As shown in FIG. 2, there may be a plurality of vias formed in the first dielectric layer 130. More particularly, a first via 136 extends from a surface of a first side (top side on FIG. 2) of the first dielectric layer 130 to a surface of the conductive feature 126. A second via 138 extends from the surface of the first side of the first dielectric layer 130 to a surface of the conductive feature 128. A third via 132 extends from a surface of a second side (bottom side on FIG. 2) of the first dielectric layer 130 to a surface of the input/output pad 122. A fourth via 134 extends from the surface of the second side of the first dielectric layer 130 to a surface of the input/output pad 122. In some embodiments, the third via 132 and the fourth via 134 are implemented as micro vias. As shown in FIG. 2, the first side and the second side described above are two opposite sides of the first dielectric layer 130. It should be noted while FIG. 2 shows the vias (e.g., 138) have a rectangular shape from the cross sectional view, the shape of the vias may vary depending on different via formation processes. For example, when a laser drilling process is employed to form the vias, the vias may be of a frustoconical shape.

Furthermore, a second dielectric layer 140 is deposited over the first side of the first dielectric layer 130. A plurality of antenna layers 142 and 144 are embedded in the second dielectric layer 140. As shown in FIG. 2, a first antenna layer 144 is formed on the surface of the first side of the first dielectric layer 130. The first antenna layer 144 is electrically coupled to the first via 136. Likewise, a second antenna layer 142 is formed on the surface of the first side of the first dielectric layer 130. The second antenna layer 142 is electrically coupled to the second via 138.

In addition, a third dielectric layer 110 is deposited over the second side of the first dielectric layer 130. One or more redistribution layers, e.g. a plurality of redistribution layers 112 and 114 is embedded in the third dielectric layer 110. The redistribution layers 112 and 114 and the third dielectric layer 110 form a redistribution structure. A plurality of metal bumps 102 are formed over the third dielectric layers 110. The metal bumps 102 are coupled to the semiconductor die 120 as well as the antenna layers 142 and 144. Throughout the description, the metal bumps 102 may be alternatively referred to as the input/output connectors of the AiP device 200.

As shown in FIG. 2, the antenna layers 142 and 144 are electrically coupled to the active circuits of the semiconductor die 120 through a conductive channel formed by vias 136, 138, the conductive features 126, 128, and vias 121, 123 within semiconductor die 120. It should be noted that the via used in this disclosure is formed by filling a conductive material in an opening. The via is a conductive via after the conductive material has been filled into the opening. Throughout the description, the conductive channel may be alternatively referred to as an antenna feeding structure, which is used to convey RF signals between the semiconductor die 120, and the antenna layers 142 and 144.

As shown in FIG. 2, the antenna feeding structure comprises three portions. A first portion of the antenna feeding structure is formed by the via (e.g., via 121) of the semiconductor die 120. In other words, the first portion of the antenna feeding structure is arranged inside the semiconductor die 120, and is connected to the active circuits thereof within the semiconductor die 120. A second portion of the antenna feeding structure is formed by the via (e.g., via 136) in the first dielectric layer 130. A third portion of the antenna feeding structure is arranged within the conductive feature (e.g., conductive feature 126). As shown in FIG. 2, the third portion (e.g., conductive feature 126) of the antenna feeding structure is coupled between the first portion (e.g., via 121) and the second portion (e.g., via 136) of the antenna feeding structure. The third portion is shown arranged along the first surface (backside) of the semiconductor die 120. In FIG. 2, the antenna feeding structure only comprises these three portions.

One advantageous feature of integrating the antenna structure (e.g., antenna layers 142 and 144) into a fan-out wafer level package is that the antenna structures shown in FIG. 2 provide a small form factor, low cost and low signal loss solution for radio frequency applications. The formation processes of the AiP device 200 will be described in detail with respect to FIGS. 11-20.

Figure 3:
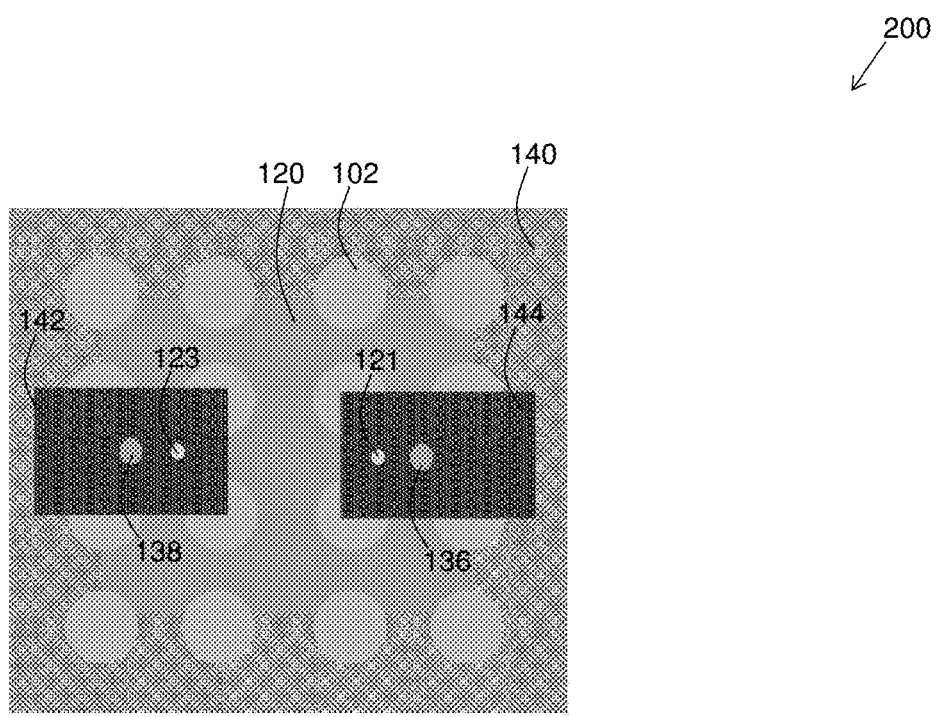
FIG. 3 illustrates a top view of the AiP device shown in FIG. 2 in accordance with various embodiments of the present disclosure.

FIG. 3 illustrates a top view of the AiP device shown in FIG. 2 in accordance with various embodiments of the present disclosure. FIG. 3 shows the boundary of the second dielectric layer 140. FIG. 3 also illustrates vias 136, 138, antenna layers 142, 144 and vias 121, 123. Referring back to FIG. 2, vias 136 and 138 are formed in the first dielectric layer 130. Antenna layers 142 and 144 are formed in the second dielectric layer 140. Vias 121 and 123 are formed in the semiconductor die 120.

It should be noted that not all features of the AiP device 200 are illustrated in FIG. 3. Furthermore, the features illustrated in FIG. 3 may not be along a same cross sectional view.

As shown in FIG. 3, the antenna layers 142 and 144 are rectangular in shape. In operation, RF signals generated by the RFIC flow through a conductive path comprising vias 121, 123, the conductive features 126, 128, vias 136, 138 and antenna layers 142, 144. Vias 121, 123, the conductive features 126, 128, and vias 136, 138 form an antenna feeding structure between the RFIC and the antenna layers 142, 144.

In some embodiments, the antenna layers 142 and 144 may be part of a transmitter. The antenna layers 142 and 144 may be configured to transmit the RF signals to a receiving circuit (not shown). In alternative embodiments, the antenna layers 142 and 144 may be part of a receiver. The antenna layers 142 and 144 may be configured to receive RF signals. The RF signals flow from the antenna layers 142 and 144 to the RFIC through the same conductive path. Furthermore, the antenna layers 142 and 144 may be part of a monostatic radar system in which both the transmitter and the receiver are collocated. The antenna layers 142 and 144 may be configured to transmit and/or receive RF signals.

It should be noted that while FIG. 3 shows the antenna layers are substantially rectangular in shape, it is merely an example. It is within the scope and spirit of the disclosure for the antenna layers 142 and 144 to comprise other shapes, such as, but not limited to oval, square, or circular. Furthermore, depending on different applications and design needs, the shape as well as the dimension of the antenna layers 142 and 144 may vary accordingly. For example, the shape and/or the dimension of the antenna layers may be modified to accommodate different RF communication frequencies.

In operation, the antenna feeding structure described above is sensitive electrically and mechanically. If the antenna feeding structure is routed within the AiP device 200 by the front side of the semiconductor die, the input/output connectors 102 cannot be placed under the semiconductor die 120. Referring back to FIG. 2, the antenna feeding structure is routed along the backside of the semiconductor die 120. Since the antenna feeding structure has been moved from the front side to the backside of the semiconductor die 120 using the via 121, 123, the input/output connectors 102 can be placed adjacent to the front side of the semiconductor die 120. For example, as shown in FIG. 3, at least four input/output connectors 102 are placed under the semiconductor die 120. One advantageous feature of placing the input/output connectors under the semiconductor die 120 is the total package size of the AiP device 200 can be reduced.

Figure 4:
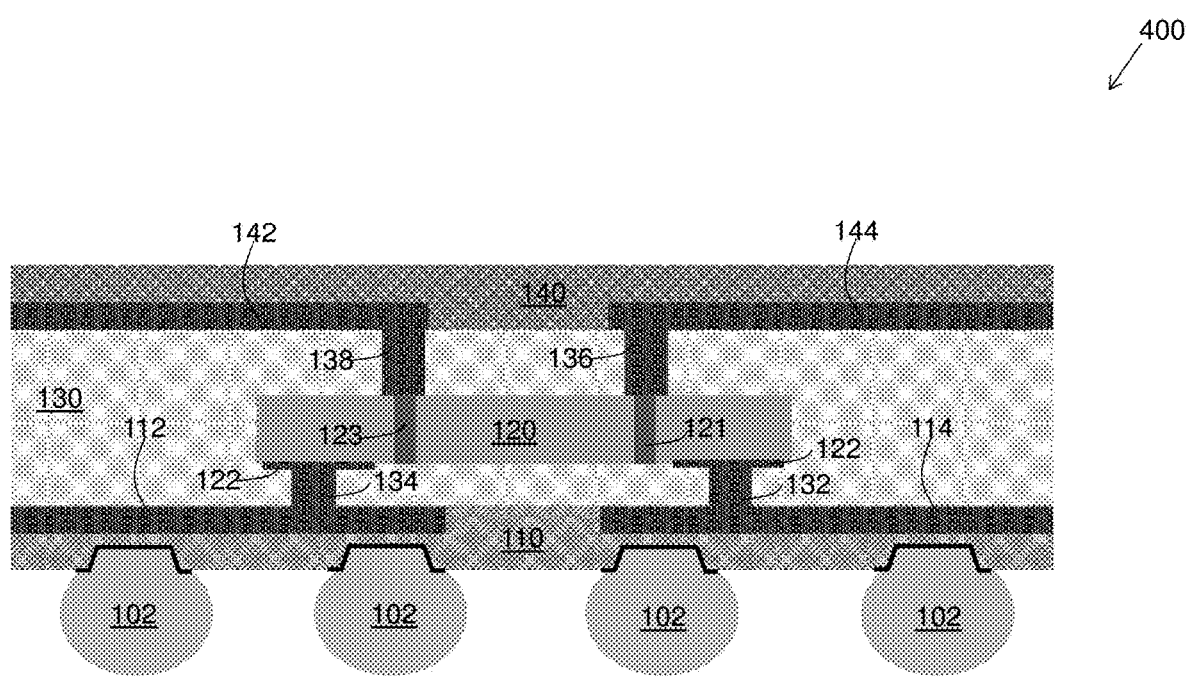
FIG. 4 illustrates a cross sectional view of a second implementation of the AiP device including the radio frequency semiconductor device shown in FIG. 1 in accordance with various embodiments of the present disclosure.

FIG. 4 illustrates a cross sectional view of a second implementation of the AiP device including the radio frequency semiconductor device shown in FIG. 1 in accordance with various embodiments of the present disclosure. The structure of the AiP device 400 is similar to that of the AiP device 200 shown in FIG. 2 except that the antenna feeding structure only comprises two portions. A first portion is arranged within the via (e.g., via 121) of the semiconductor die 120. A second portion (e.g., via 136) is arranged within the via in the first dielectric layer 130.

As shown in FIG. 4, the first portion (e.g., via 121) of the antenna feeding structure is in direct contact with the second portion (e.g., via 136), i.e. the first portion prolongs the second portion directly. The antenna layer (e.g., antenna layer 144) is electrically coupled to the semiconductor die 120 through the second portion (e.g., via 136) formed in the first dielectric layer 130 and the first portion (e.g., via 121) formed in the semiconductor die 120. As shown in FIG. 4, the width (the diameter of the via) of the second portion (e.g., via 136) is greater than the width of the first portion (e.g., via 121).

It should be noted that the dimensions of the first portion and the second portion of the antenna feeding structure shown in FIG. 4 are merely an example. Depending on different applications and design needs, the dimensions of the first portion and the second portion of the antenna feeding structure may vary accordingly. For example, the width of the first portion (e.g., via 121) is greater than the width of the second portion (e.g., via 136).

Figure 5:
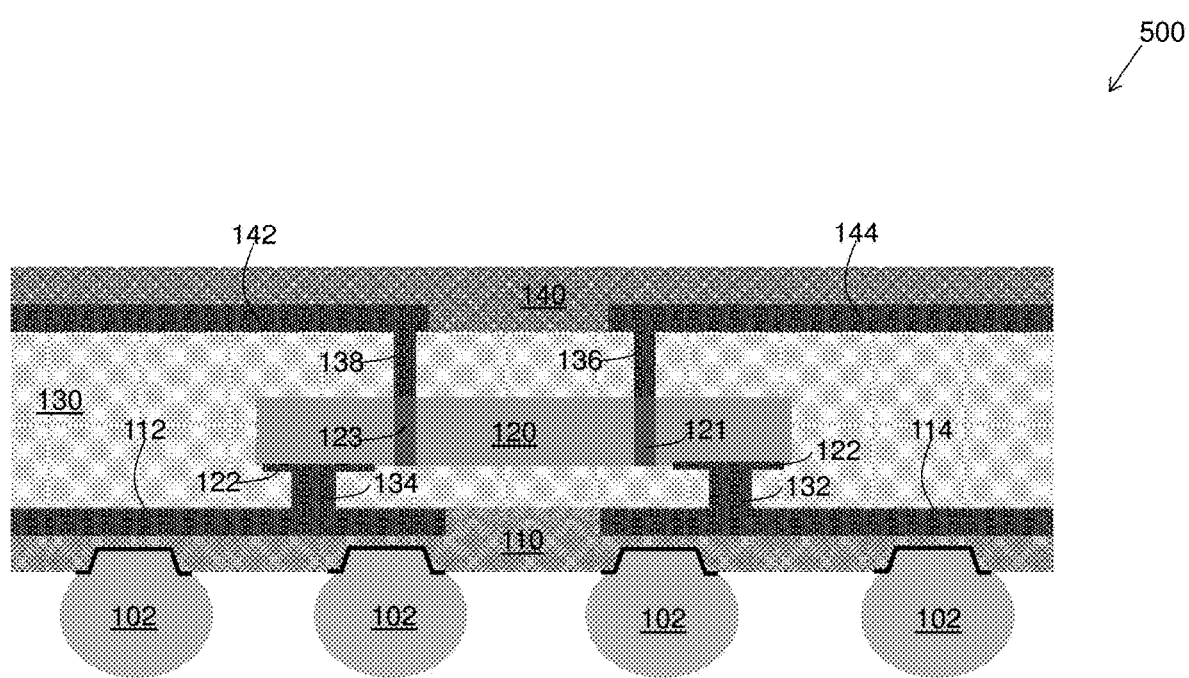
FIG. 5 illustrates a cross sectional view of a third implementation of the AiP device including the radio frequency semiconductor device shown in FIG. 1 in accordance with various embodiments of the present disclosure.

FIG. 5 illustrates a cross sectional view of a third implementation of the AiP device including the radio frequency semiconductor device shown in FIG. 1 in accordance with various embodiments of the present disclosure. The structure of the AiP device 500 is similar to that of the AiP device 400 shown in FIG. 4 except that the width of the second portion (e.g., via 136) is equal to the width of the first portion (e.g., via 121).

One advantageous feature of having the width of the second portion equal to the width of the first portion is these two vias (e.g., vias 121 and 136) can be formed in a same via forming process such as a laser drilling process.

Figure 6:
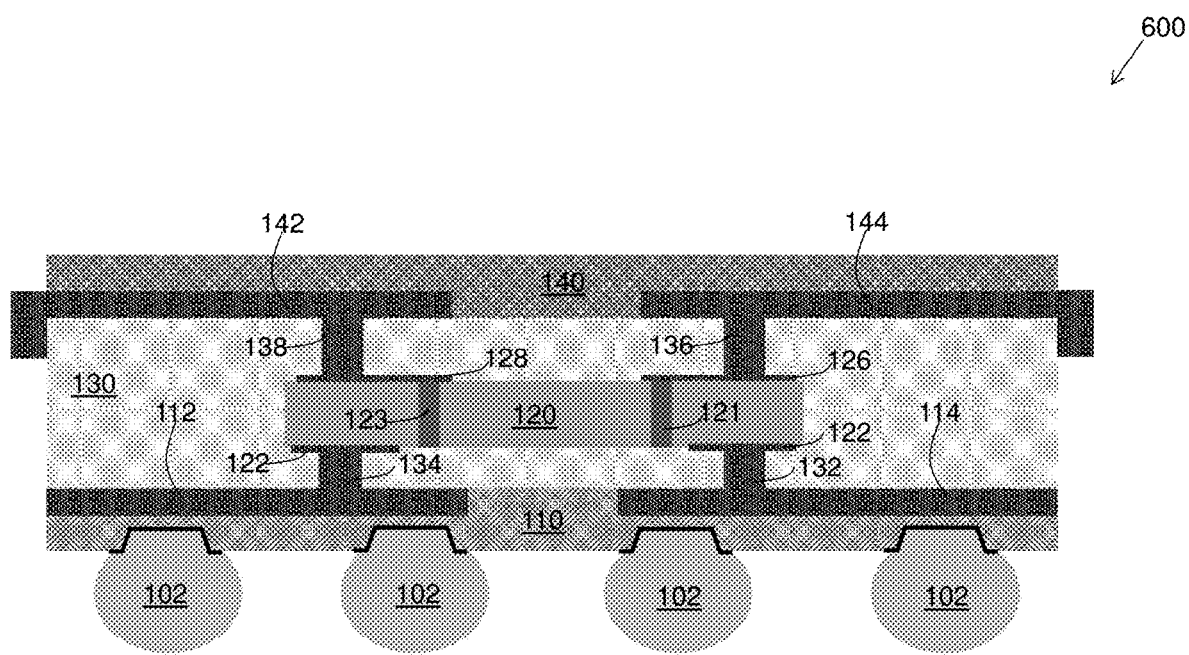
FIG. 6 illustrates a cross sectional view of a fourth implementation of the AiP device including the radio frequency semiconductor device shown in FIG. 1 in accordance with various embodiments of the present disclosure.

FIG. 6 illustrates a cross sectional view of a fourth implementation of the AiP device including the radio frequency semiconductor device shown in FIG. 1 in accordance with various embodiments of the present disclosure. The structure of the AiP device 600 is similar to that of the AiP device 200 shown in FIG. 2 except that the antenna layers 142 and 144 extend over the sidewalls of the AiP device 600. In other words, the antenna layers 142 define antennas which extend over the sidewalls of the AiP device 600. As shown in FIG. 6, the antenna layer 142 partially covers the leftmost sidewall of the AiP device 600. Likewise, the antenna layer 142 partially covers the rightmost sidewall of the AiP device 600.

Extending the antenna layers over the sidewalls of the AiP device 600 shown in FIG. 6 is merely an example. Depending on different applications and design needs, there may be many variations, modifications and alternatives. For example, the antenna layer 142 may fully cover the sidewall of the first dielectric layer 130, or only one of the antenna layers may extend over the sidewall of the first dielectric layer 130.

Figure 7:
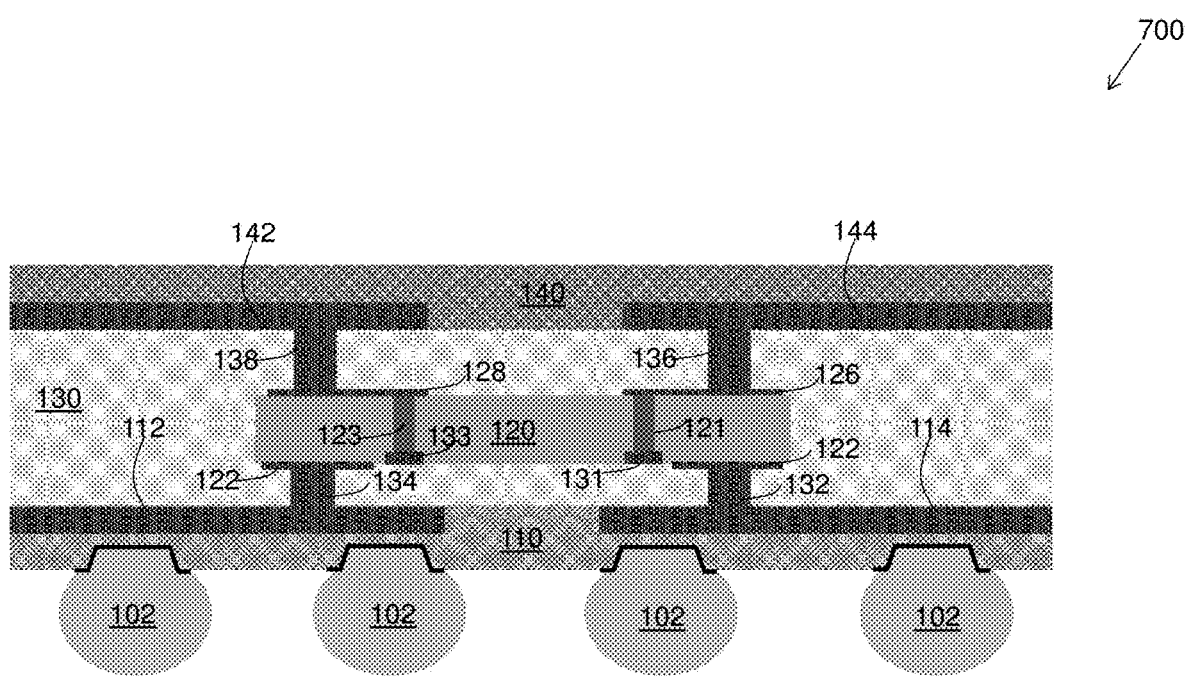
FIG. 7 illustrates a cross sectional view of a fifth implementation of the AiP device including the radio frequency semiconductor device shown in FIG. 1 in accordance with various embodiments of the present disclosure.

FIG. 7 illustrates a cross sectional view of a fifth implementation of the AiP device including the radio frequency semiconductor device shown in FIG. 1 in accordance with various embodiments of the present disclosure. The structure of the AiP device 700 is similar to that of the AiP device 200 shown in FIG. 2 except that the vias 121 and 123 are not through vias.

As shown in FIG. 7, the semiconductor die 120 comprises conductive contacts 131 and 133. The conductive contacts 131 and 133 are embedded in the semiconductor die 120. As shown in FIG. 7, the via 121 extends partially through the semiconductor die 120. The first terminal of the via 121 is in direct contact with the conductive feature 126. The second terminal of the via 121 is in direct contact with the conductive contact 131. Likewise, The via 123 extends partially through the semiconductor die 120. The first terminal of the via 123 is in direct contact with the conductive feature 128. The second terminal of the via 123 is in direct contact with the conductive contact 133.

Figure 8:
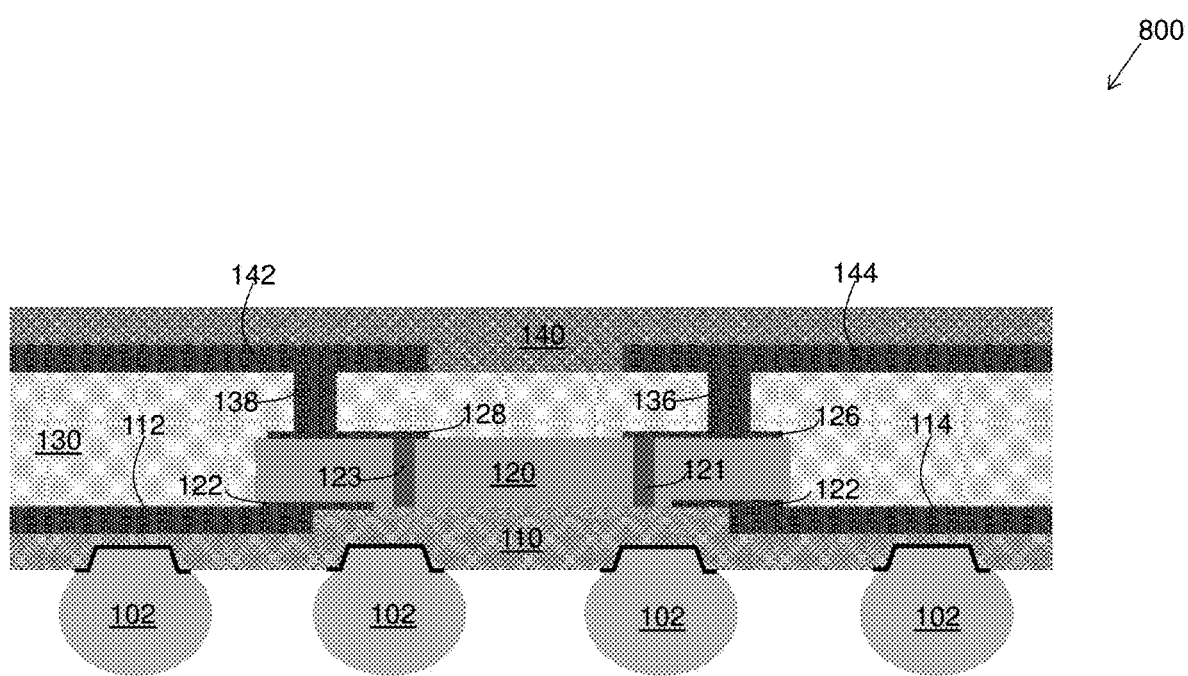
FIG. 8 illustrates a cross sectional view of a sixth implementation of the AiP device including the radio frequency semiconductor device shown in FIG. 1 in accordance with various embodiments of the present disclosure.

FIG. 8 illustrates a cross sectional view of a sixth implementation of the AiP device including the radio frequency semiconductor device shown in FIG. 1 in accordance with various embodiments of the present disclosure. The structure of the AiP device 800 is similar to that of the AiP device 200 shown in FIG. 2 except that the semiconductor die 120 is connected to the redistribution structure directly. In contrast with the AiP device 200 shown in FIG. 2, the semiconductor die 120 is in direct contact with the third dielectric layer 110. As shown in FIG. 8, the input/output pads 122 of the semiconductor die 120 are electrically coupled to the redistribution layer 112 and 114 directly. Compared with the AiP device 200 shown in FIG. 2, no vias 132 and 134 are needed to electrically couple the redistribution layer 112 and 114 with the input/output pads 122 of the semiconductor die 120.

Figure 9:
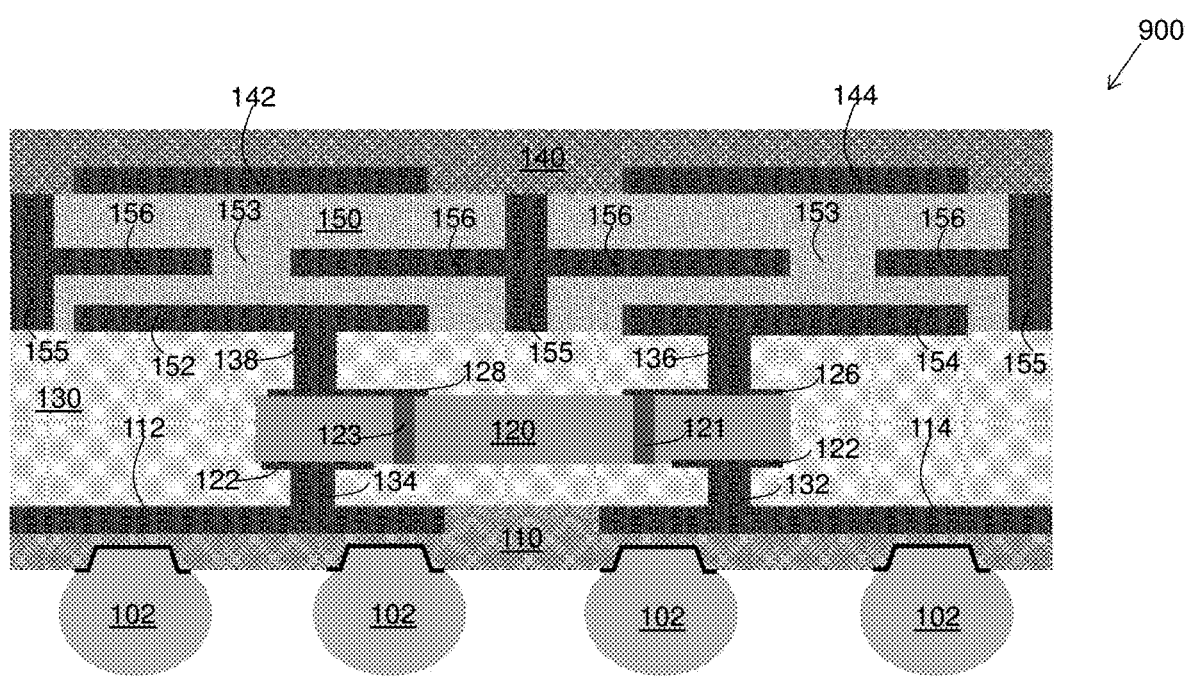
FIG. 9 illustrates a cross sectional view of a seventh implementation of the AiP device including the radio frequency semiconductor device shown in FIG. 1 in accordance with various embodiments of the present disclosure.

FIG. 9 illustrates a cross sectional view of a seventh implementation of the AiP device including the radio frequency semiconductor device shown in FIG. 1 in accordance with various embodiments of the present disclosure. The structure of the AiP device goo is similar to that of the AiP device 200 shown in FIG. 2 except that the antenna structure has multiple metal and dielectric layers. As shown in FIG. 9, an additional dielectric layer 150 is formed between the first dielectric layer 130 and the second dielectric layer 140.

The dielectric layer 150 may be formed of a high performance RF material such as Rogers 3003. The antenna layers 142 and 144 are formed on a first surface of the dielectric layer 150. The antenna layers 142 and 144 are embedded in the second dielectric layer 140. As shown in FIG. 9, the antenna layers 142 and 144 are not electrically coupled to the semiconductor die 120. Instead, the antenna layers 142 and 144 are magnetically coupled to conductive features 152 and 154 respectively.

As shown in FIG. 9, the AiP device goo comprises a plurality of metal structures comprising horizontal metal lines 156 and vertical metal lines 155. In some embodiments, the horizontal metal lines 156 and the vertical metal lines 155 are electrically grounded. As shown in FIG. 9, the vertical metal lines 155 extend through the dielectric layer 150. The vertical metal lines 155 are between the second dielectric layer 140 and the first dielectric layer 130.

As shown in FIG. 9, openings 153 may be formed in the horizontal metal lines 156. A first opening (opening 153 on the left) is between the antenna layer 142 and the conductive feature 152. A second opening (opening 153 on the right) is between the antenna layer 144 and the conductive feature 154. The conductive features 152 and 154 are electrically coupled to the semiconductor die 120 through the antenna feeding structure. The RF signals generated by the semiconductor die 120 are sent to the conductive features 152 and 154 first, and then are electromagnetically coupled to the antenna layers 142 and 144 through the openings 153.

Figure 10:
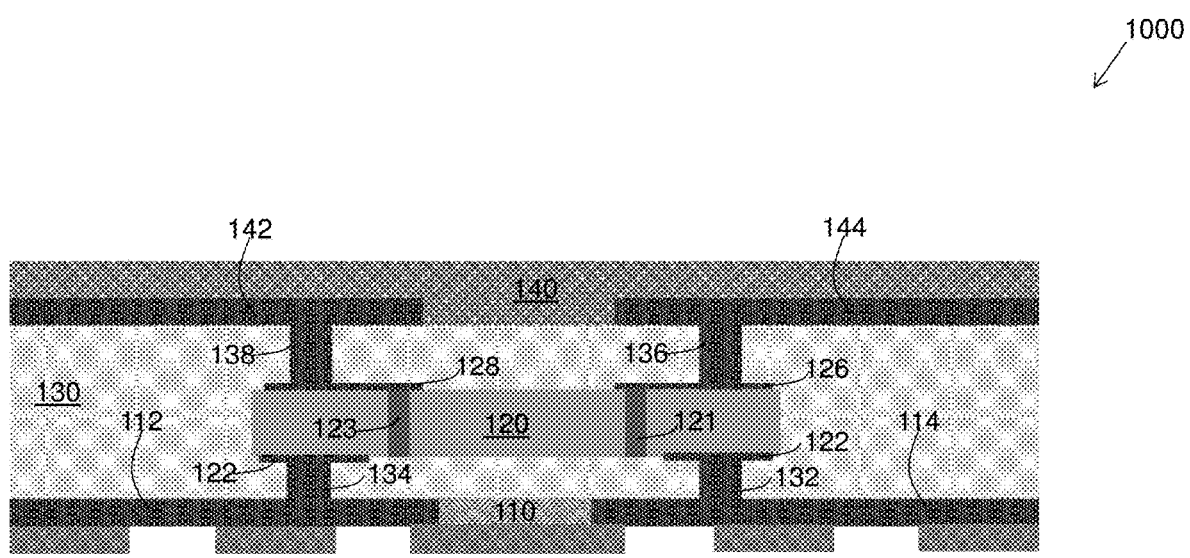
FIG. 10 illustrates a cross sectional view of an eighth implementation of the AiP device including the radio frequency semiconductor device shown in FIG. 1 in accordance with various embodiments of the present disclosure.

FIG. 10 illustrates a cross sectional view of an eighth implementation of the AiP device including the radio frequency semiconductor device shown in FIG. 1 in accordance with various embodiments of the present disclosure. The structure of the AiP device 1000 is similar to that of the AiP device 200 shown in FIG. 2 except that the input/output connectors of the AiP device 1000 are implemented as land grid array (LGA) pads. The IGA pads are well known in the art, and hence are not discussed in further detail to avoid repetition.

It should be noted that that features and embodiments described above with respect to one particular AiP device may be applicable to any other AiP devices described in FIGS. 2-10. For example, depending on different applications and design needs, the antenna feeding structure (e.g., vias 121 and 136) shown in FIG. 4 may be used to replace the antenna feeding structure (e.g., via 121, conductive feature 126 and via 136) shown in FIG. 10.

FIGS. 11-20 illustrate intermediate steps of fabricating the AiP device shown in FIG. 2 in accordance with various embodiments of the present disclosure. It should be noted that the fabrication steps as well as the AiP structure shown in FIGS. 11-20 are merely an example. A person skilled in the art will recognize there may be many alternatives, variations and modifications.

Figure 11:
FIGS. 11-20 illustrate intermediate steps of fabricating the AiP device shown in FIG. 2 in accordance with various embodiments of the present disclosure.

FIG. 11 illustrates a cross sectional view of a carrier in accordance with various embodiments of the present disclosure. The carrier 1102 may be formed of silicon, glass, ceramic aluminum oxide, silicon oxide, any combinations thereof and/or the like. A release layer (not shown) may be formed over the carrier 1102. In some embodiments, the release layer is formed of an epoxy-based thermal-release material. In alternative embodiments, the release layer may be formed of an ultra-violet (UV) glue, which loses its adhesive property when exposed to UV lights. Furthermore, the release layer may be formed of a light-to-heat conversion layer, which loses its adhesive property after the release layer has been exposed to laser light.

Figure 12:
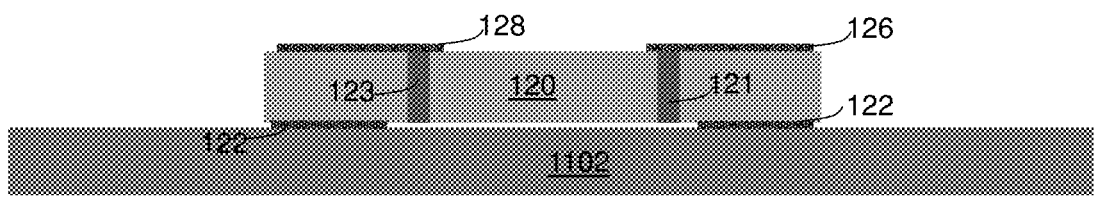

FIG. 12 illustrates a cross sectional view of a semiconductor device after a semiconductor die has been mounted on the carrier in accordance with various embodiments of the present disclosure. The semiconductor die 120 comprises a plurality of input/output pads 122 formed on a front side of the semiconductor die 120, a plurality of vias 121, 123 extending through the semiconductor die 120, and a plurality of conductive features 126, 128 formed on a backside of the semiconductor die 120.

As shown in FIG. 12, the front side of the semiconductor die 120 is mounted on the carrier 1102. The input/output pads 122 are in direct contact with the carrier 1102. The conductive features 126 and 128 are formed on the backside of the semiconductor die 120. The conductive features 126 and 128 may be formed by suitable semiconductor fabrication processes such as plating and the like.

It should be noted that the semiconductor die 120 is drawn without details. The semiconductor die 120 may comprise a substrate, active circuits (e.g., RFIC), a plurality of inter-layer dielectric (ILD) layers and inter-metal dielectric (IMD) layers.

The substrate of the semiconductor die 120 may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The active circuits formed on the substrate may be any type of circuitry suitable for a particular application. In accordance with an embodiment, the active circuits may include various n-type metal-oxide semiconductor (NMOS) and/or p-type metal-oxide semiconductor (PMOS) devices such as transistors, capacitors, resistors, diodes, photo-diodes, fuses and/or the like. The active circuits may be interconnected to perform one or more functions. The functions may include radio frequency circuits, memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Throughout the description, the side of the semiconductor die having active circuits is alternatively referred to as the front side of the semiconductor die 120. On the other hand, the side of the semiconductor die not having active circuits is referred to as the backside of the semiconductor die 120.

It should be noted that while FIG. 12 illustrates a single semiconductor die mounted on the carrier 1102, the carrier 1102 may accommodate any number of semiconductor dies.

Figure 13:
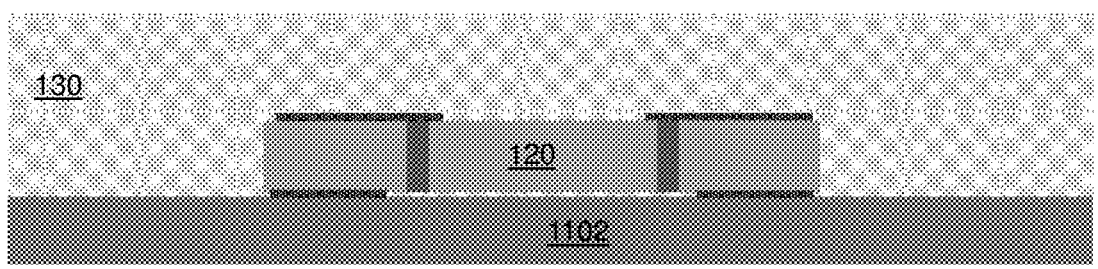

FIG. 13 illustrates a cross sectional view of the semiconductor device shown in FIG. 12 after a first dielectric layer is formed over the semiconductor device in accordance with various embodiments of the present disclosure. In some embodiments, the first dielectric layer 130 is formed of suitable dielectric materials such as epoxy resin, glass fiber (e.g., pre-preg), mold compound materials and the like. In some embodiments, the first dielectric layer 130 is a molding compound layer. The molding compound layer 130 may be formed of epoxy based resins and the like. Alternatively, the molding compound layer 130 may be replaced by photo-sensitive materials including polybenzoxazole (PBO), SU-8 photo-sensitive epoxy, film type polymer materials and/or the like. Throughout the description, the first dielectric layer 130 may be alternatively referred to as a molding compound layer.

In accordance with an embodiment, the molding compound layer 130 is either laminated or coated over the semiconductor die 120. One advantageous feature of having a molding compound layer laminated or coated on top of the semiconductor die 120 is that the effective die area of the semiconductor die 120 can be expanded so that a fan-out package can be formed based upon the molding compound layer 130.

Figure 14:
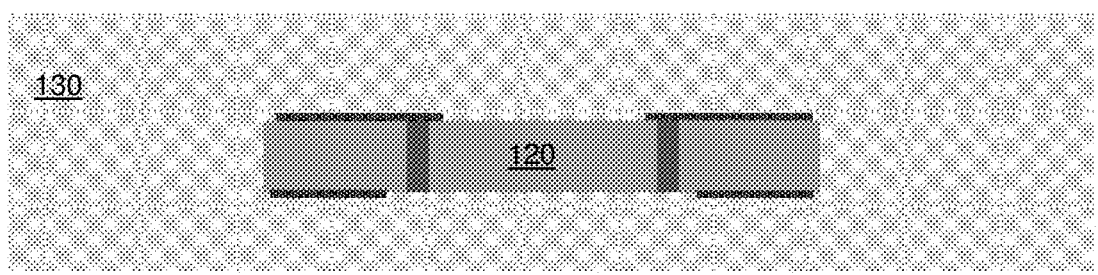

FIG. 14 illustrates a cross sectional view of the semiconductor device shown in FIG. 13 after the carrier has been removed and additional dielectric materials have been deposited over the semiconductor die in accordance with various embodiments of the present disclosure. The carrier 1102 shown in FIG. 13 can be detached from the semiconductor device. A variety of detaching processes may be employed to separate the semiconductor device from the carrier 1102. The variety of detaching processes may comprise a chemical solvent, a UV exposure, a laser de-bonding process and the like.

After the carrier 1102 has been detached, additional dielectric materials have been deposited over the semiconductor die 120. The additional dielectric materials are similar to that of the first dielectric layer 130. The additional dielectric materials may be formed over the front side of the semiconductor die 120 using a same or similar formation process discussed above. As a result of depositing more dielectric materials over the semiconductor die 120, the semiconductor die 120 is fully covered by the first dielectric layer 130.

Figure 15:
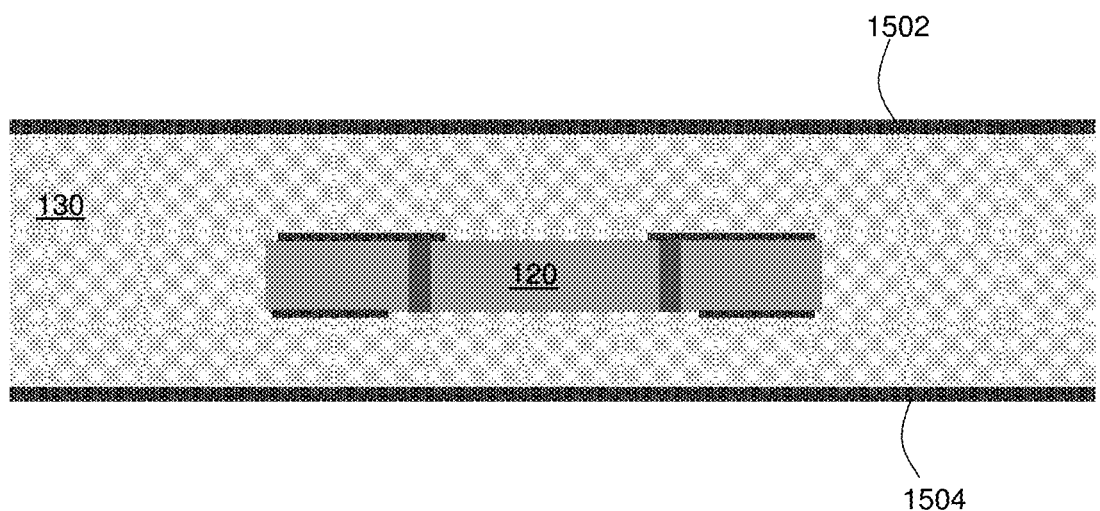

FIG. 15 illustrates a cross sectional view of the semiconductor device shown in FIG. 14 after two seed layers have been formed over the first dielectric layer in accordance with various embodiments of the present disclosure. A first seed layer 1502 is formed on a first surface of the first dielectric layer 130. A second seed layer 1504 is formed on a second surface of the first dielectric layer 130. The seed layers 1502 and 1504 may comprise a suitable conductive material such as copper. In some embodiments, the seed layers 1502 and 1504 are formed using a suitable formation method such as chemical vapor deposition (CVD), physical vapor deposition (PVD) and the like.

Figure 16:
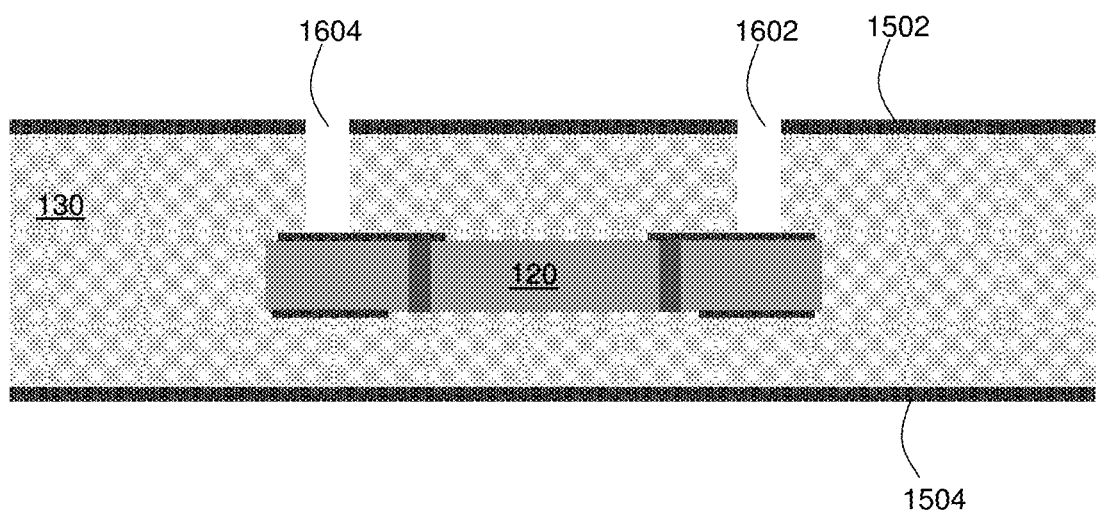

FIG. 16 illustrates a cross sectional view of the semiconductor device shown in FIG. 15 after two openings have been formed in the first dielectric layer in accordance with various embodiments of the present disclosure. A first opening 1602 and a second opening 1604 are formed in the first dielectric layer 130. As shown in FIG. 16, the openings 1602 and 1604 extend from the first seed layer 1502 to the conductive features on the backside of the semiconductor die 120. The openings 1602 and 1604 may be formed by a suitable drilling process such as a laser drilling process. After the openings 1602 and 1604 have been formed, the top surfaces of the conductive features are exposed.

Figure 17:
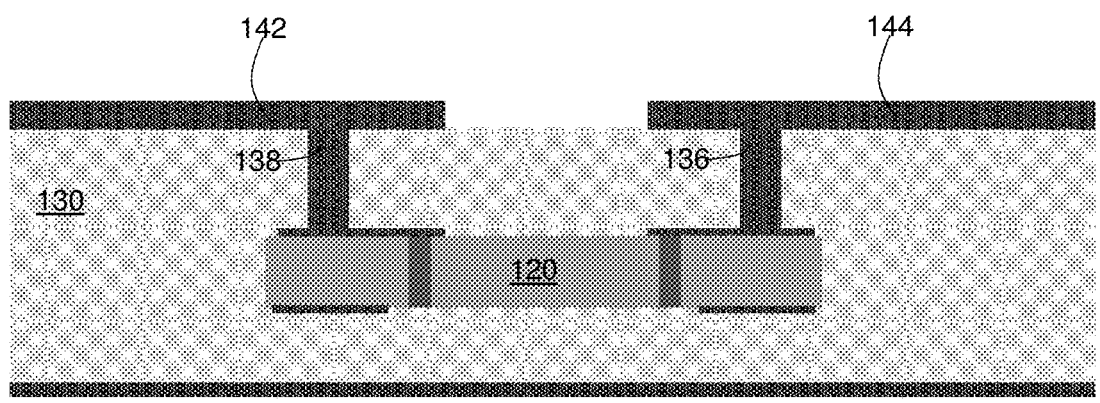

FIG. 17 illustrates a cross sectional view of the semiconductor device shown in FIG. 16 after a conductive material has been filled in the openings in accordance with various embodiments of the present disclosure. A conductive material (e.g., copper) has filled the openings 1602 and 1604 (shown in FIG. 17) to form the vias 136 and 138. Furthermore, the conductive material is used to form the antenna layers 142 and 144 using a suitable formation method such as plating.

The formation process of the antenna layers 142 and 144 comprises depositing a first photoresist layer over the first seed layer 1502 (shown in FIG. 16), plating the conductive material over exposed portions of the first seed layer to form the antenna layers 142 and 144, removing the first photoresist layer to expose the first seed layer under the first photoresist layer, and after removing the first photoresist layer, applying a first etching process to remove exposed portions of the first seed layer. The first photoresist layer is of a first predetermined pattern, which matches the shape of the antenna layers 142 and 144.

Figure 18:
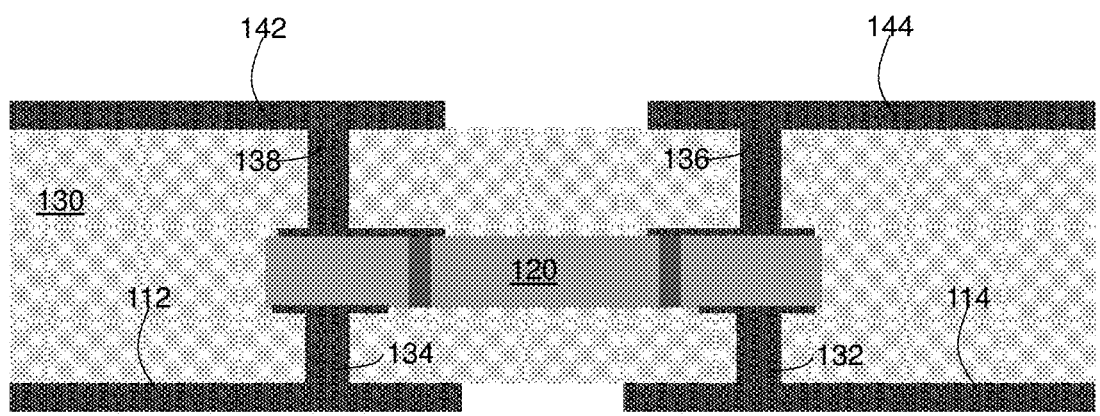

FIG. 18 illustrates a cross sectional view of the semiconductor device shown in FIG. 17 after the redistribution layer has been formed in accordance with various embodiments of the present disclosure. Similar to the process of forming the antenna layers shown in FIG. 17, two openings are formed in the first dielectric layer 130 and under the semiconductor die 120. The conductive material (e.g., copper) is filled in the openings to form the vias 132 and 134. Furthermore, the conductive material is used to form the redistribution layers 112 and 114 using a suitable formation method such as plating.

The formation process of the redistribution layers 112 and 114 comprises depositing a second photoresist layer over the second seed layer 1504 (shown in FIG. 16), plating the conductive material over exposed portions of the second seed layer to form the redistribution layers 112 and 114, removing the second photoresist layer to expose the second seed layer under the second photoresist layer, and after removing the second photoresist layer, applying a second etching process to remove exposed portions of the second seed layer. The second photoresist layer is of a second predetermined pattern, which matches the shape of the redistribution layers 112 and 114.

Figure 19:
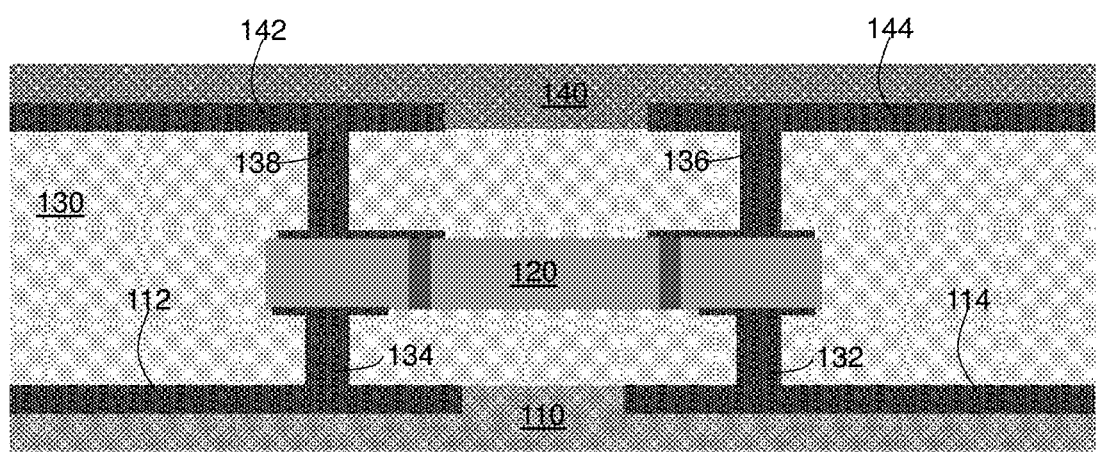

FIG. 19 illustrates a cross sectional view of the semiconductor device shown in FIG. 18 after additional dielectric layers have been formed in accordance with various embodiments of the present disclosure. The second dielectric layer 140 is formed over the upper surface of the first dielectric layer 130. After the second dielectric layer 140 has been formed, the antenna layers 142 and 144 are embedded in the second dielectric layer 140. In some embodiments, the second dielectric layer 140 may be formed of a different dielectric material than that of the first dielectric layer 130. For example, the second dielectric layer 140 may be a solder resist layer. Alternatively, the second dielectric layer 140 may be formed of a same material as the first dielectric layer 130.

Furthermore, the third dielectric layer 110 is formed over the lower surface of the first dielectric layer 130. After the third dielectric layer 110 has been formed, the redistribution layers 112 and 114 are embedded in the third dielectric layer 110. In some embodiments, the third dielectric layer 110 may be formed of a suitable polymer such as polybenzoxazole (PBO), polyimide, benzocyclobutene (BCB), any combinations thereof and the like. In alternative embodiments, the third dielectric layer 110 may be formed of a suitable nitride based material such as silicon nitride. Furthermore, other suitable dielectric materials such as silicon oxide, phosphosilicate glass (PSG), borosilicate glass (BSG), boron-doped phosphosilicate glass (BPSG) may be used to form the third dielectric layer 110.

The dielectric layers 110 and 140 may be formed by suitable deposition processes such as spin coating, laminating, CVD, PVD and the like. The redistribution layers 112, 14 and the third dielectric layer 110 may be collectively referred to as a redistribution structure.

It should be noted that while FIG. 19 shows the redistribution structure comprises one dielectric layer and one layer of conductive metal lines, the redistribution structure may include multiple layers of conductive features (e.g., conductive metal lines and vias) formed in multiple dielectric layers.

Figure 20:
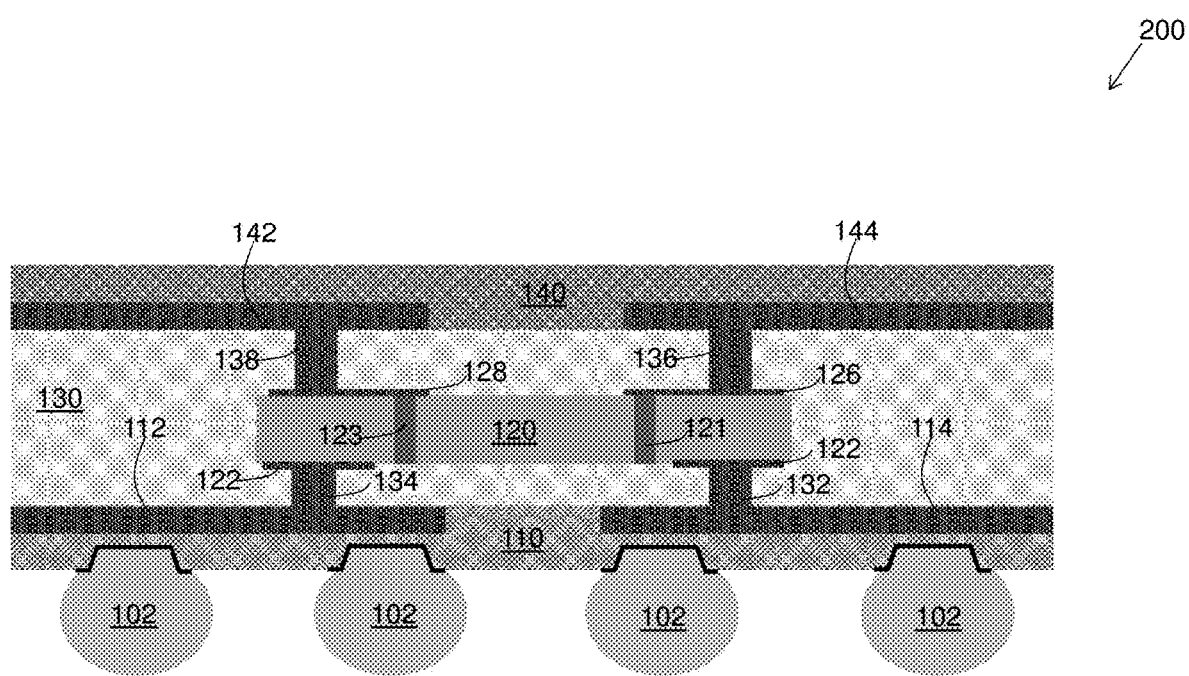

FIG. 20 illustrates a cross sectional view of the semiconductor device shown in FIG. 19 after a plurality of input/output connectors has been formed in accordance with various embodiments of the present disclosure. The input/output connectors 102 extend into the third dielectric layer 110. The input/output connectors 102 are mechanically and electrically coupled with the redistribution layers 112 and 114. In some embodiments, the input/output connectors 102 are conductive bumps such as controlled collapse chip connection (C4) bumps. The C4 bumps comprise a suitable conductive material such as tin. In alternative embodiments, the input/output connectors 102 may be implemented as solder bumps.

One advantageous feature of the AiP device shown in FIG. 20 is at least one input/output connector is laterally between two sidewalls of the semiconductor die 120. In a conventional AiP device, the antenna feeding structure is routed along the front side of the semiconductor die. In order to prevent the input/output connectors from interfering with the antenna feeding structure, the input/output connectors cannot be placed under the semiconductor die. In other words, the input/output connectors cannot be placed between two sidewalls of the semiconductor die. In the present disclosure, the antenna feeding structure is routed along the backside of the semiconductor die 120. As a result of having this antenna feeding structure arrangement, the input/output connectors 102 can be placed between two sidewalls of the semiconductor die 120.

Figure 21:
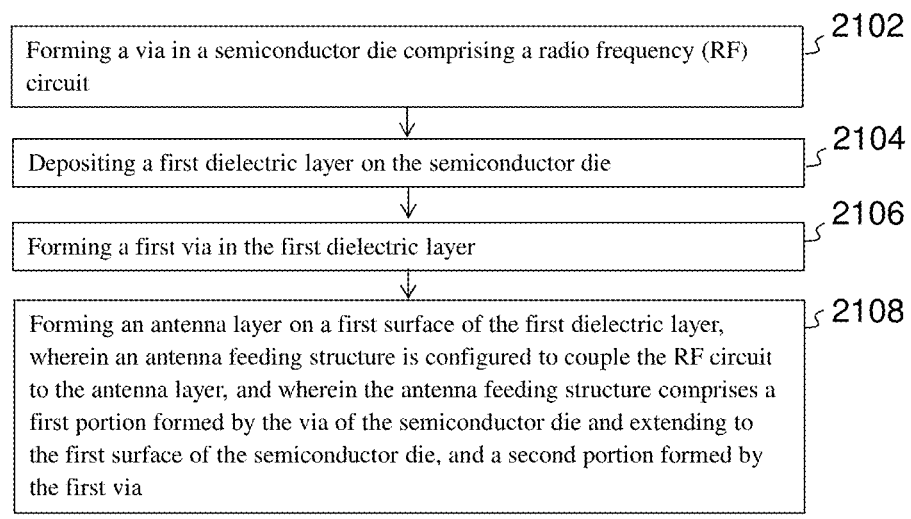
FIG. 21 illustrates a flow chart of a method for fabricating the AiP device shown in FIG. 2 in accordance with various embodiments of the present disclosure.

FIG. 21 illustrates a flow chart of a method for fabricating the AiP device shown in FIG. 2 in accordance with various embodiments of the present disclosure. This flowchart shown in FIG. 21 is merely an example, which should not unduly limit the scope of the claims. One of ordinary skill in the art would recognize many variations, alternatives, and modifications. For example, various steps illustrated in FIG. 21 may be added, removed, replaced, rearranged and repeated.

At step 2102, a via is formed in a semiconductor die. The semiconductor die comprises a plurality of radio frequency circuits and a plurality of vias. The semiconductor die further comprises a plurality of input/output pads formed on a front side of the semiconductor die. A plurality of conductive features is formed on a backside of the semiconductor die. The conductive features are electrically coupled to the plurality of radio frequency circuits through the vias formed in the semiconductor die.

At step 2104, a first dielectric layer is deposited over the backside of the semiconductor die. The first dielectric layer is a molding compound layer. The backside of the semiconductor die is fully covered by the first dielectric layer.

At step 2106, a first via is formed in the first dielectric layer. The formation of the first via comprises forming a first opening in the first dielectric layer and filling the first opening to form the first via a conductive material. In some embodiments, the conductive material is copper.

At step 2108, an antenna layer is formed on a first surface of the first dielectric layer. The antenna layer is formed by suitable semiconductor fabrication processes such as plating. The via in the semiconductor die, the conductive feature on the backside of the semiconductor and the first via in the first dielectric layer form an antenna feeding structure. The antenna feeding structure is configured to couple the plurality of radio frequency circuits to the antenna layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating an antenna-in-package (AiP) device comprising:
    forming a via, by a via formation process, in a semiconductor die comprising a radio frequency (RF) circuit;
    depositing a first dielectric layer over a first surface of the semiconductor die by a deposition process;
    forming a first via in the first dielectric layer; and
    forming an antenna layer on a first surface of the first dielectric layer, wherein an antenna feeding structure is configured to couple the RF circuit to the antenna layer, and wherein the antenna feeding structure comprises a first portion formed by the via of the semiconductor die and extending to the first surface of the semiconductor die, and a second portion formed by the first via.

2. The method for fabricating the AiP device of claim 1, further comprising:
    forming a first opening in the first dielectric layer;
    filling the first opening to form the first via, and forming the antenna layer over the first surface of the first dielectric layer with a conductive material, wherein the antenna layer is electrically coupled to the RF circuit of the semiconductor die through the antenna feeding structure;
    forming a second opening in the first dielectric layer, wherein the second opening and the first opening are on opposite sides of the semiconductor die;
    filling the second opening to form a second via, and forming a redistribution layer over a second surface of the first dielectric layer with the conductive material;
    depositing a second dielectric layer over the first surface of the first dielectric layer, wherein the antenna layer is embedded in the second dielectric layer; and
    depositing a third dielectric layer over the second surface of the first dielectric layer, wherein the redistribution layer is embedded in the third dielectric layer.

3. The method for fabricating the AiP device of claim 2, further comprising:
    forming a first seed layer on the first surface of the first dielectric layer prior to forming the first opening in the first dielectric layer; and
    forming a second seed layer on the second surface of the first dielectric layer prior to forming the second opening in the first dielectric layer.

4. The method for fabricating the AiP device of claim 3, further comprising:
    depositing a first photoresist layer over the first seed layer, wherein the first photoresist layer is of a first predetermined pattern;
    plating the conductive material over exposed portions of the first seed layer to form the antenna layer;
    removing the first photoresist layer to expose the first seed layer under the first photoresist layer; and
    after removing the first photoresist layer, applying a first etching process to remove the exposed portions of the first seed layer.

5. The method for fabricating the AiP device of claim 3, further comprising:
depositing a second photoresist layer over the second seed layer, wherein the second photoresist layer is of a second predetermined pattern;
plating the conductive material over exposed portions of the second seed layer to form the redistribution layer;
removing the second photoresist layer to expose the second seed layer under the second photoresist layer; and
after removing the second photoresist layer, applying a second etching process to remove the exposed portions of the second seed layer.

6. The method for fabricating the AiP device of claim 3, further comprising:
attaching a plurality of input/output connectors to the redistribution layer, wherein the plurality of input/output connectors and the antenna layer are on the opposite sides of the semiconductor die.

7. The method for fabricating the AiP device of claim 6, wherein:
at least one input/output connector of the plurality of input/output connectors is directly underneath the semiconductor die.

8. An antenna-in-package (AiP) device comprising:
a semiconductor die comprising a via formed by a via formation process and a radio frequency (RF) circuit;
a first dielectric layer disposed over a first surface of the semiconductor die;
an antenna layer disposed over a surface of the first dielectric layer formed by a deposition process; and
an antenna feeding structure comprising a first portion formed by the via of the semiconductor die, and a second portion within the first dielectric layer, wherein the antenna layer is coupled to the RF circuit of the semiconductor die through the antenna feeding structure.

9. The AiP device of claim 8, wherein:
the antenna feeding structure further comprises a conductive feature extending on the first surface of the semiconductor die, and wherein the conductive feature is coupled between the first portion of the antenna feeding structure and the second portion of the antenna feeding structure.

10. The AiP device of claim 8, further comprising:
a redistribution structure comprising a redistribution layer and a second dielectric layer, and wherein the redistribution structure is over a second surface of the semiconductor die, and the redistribution layer is embedded in the second dielectric layer; and
a plurality of input/output pads electrically coupled to the semiconductor die through the redistribution structure.

11. The AiP device of claim 8, wherein:
the second portion of the antenna feeding structure is a first via formed in the first dielectric layer, and wherein the first via is in direct contact with the via of the semiconductor die.

12. The AiP device of claim 11, wherein:
a width of the via of the semiconductor die is equal to a width of the first via.

13. A method for fabricating an antenna-in-package (AiP) device comprising:
providing a semiconductor die comprising a first circuit, and a first via extending from a first surface of the semiconductor die to a second surface of the semiconductor die opposite the first surface,
depositing a first dielectric layer over a first surface of the semiconductor die by a deposition process, and
forming a second via in the first dielectric layer by a via formation process; and
forming an antenna layer on a first surface of the first dielectric layer, wherein the first via and the second via are configured to form at least a portion of path operatively coupling the first circuit to the antenna layer.

14. The method for fabricating the AiP device of claim 13, further comprising:
forming a first opening in the first dielectric layer;
filling the first opening to form the second via, and forming the antenna layer over the first surface of the first dielectric layer with a conductive material;
forming a second opening in the first dielectric layer, wherein the second opening and the first opening are on opposite sides of the semiconductor die;
filling the second opening to form a third via, and forming a redistribution layer over a second surface of the first dielectric layer with the conductive material;
depositing a second dielectric layer over the first surface of the first dielectric layer, wherein the antenna layer is embedded in the second dielectric layer; and
depositing a third dielectric layer over the second surface of the first dielectric layer, wherein the redistribution layer is embedded in the third dielectric layer.

15. The method for fabricating the AiP device of claim 14, further comprising:
forming a first seed layer on the first surface of the first dielectric layer prior to forming the first opening in the first dielectric layer; and
forming a second seed layer on the second surface of the first dielectric layer prior to forming the second opening in the first dielectric layer.

16. The method for fabricating the AiP device of claim 15, further comprising:
depositing a first photoresist layer over the first seed layer, wherein the first photoresist layer is of a first predetermined pattern;
plating the conductive material over exposed portions of the first seed layer to form the antenna layer;
removing the first photoresist layer to expose the first seed layer under the first photoresist layer; and
after removing the first photoresist layer, applying a first etching process to remove exposed portions of the first seed layer.

17. The method for fabricating the AiP device of claim 15, further comprising:
depositing a second photoresist layer over the second seed layer, wherein the second photoresist layer is of a second predetermined pattern;
plating the conductive material over exposed portions of the second seed layer to form the redistribution layer;
removing the second photoresist layer to expose the second seed layer under the second photoresist layer; and
after removing the second photoresist layer, applying a second etching process to remove the exposed portions of the second seed layer.

18. The method for fabricating the AiP device of claim 15, further comprising:
attaching a plurality of input/output connectors to the redistribution layer, wherein the plurality of input/output connectors and the antenna layer are on the opposite sides of the semiconductor die.

19. The method for fabricating the AiP device of claim 18, wherein:
   at least one input/output connector of the plurality of input/output connectors is directly underneath the semiconductor die.

20. The method for fabricating the AiP device of claim 13, wherein the first circuit comprises a radio frequency (RF) circuit.

21. The method of claim 1, wherein the via formation process comprises a laser drilling process.

22. The method of claim 1, wherein the deposition process comprises chemical vapor deposition (CVD) or physical vapor deposition (PVD).

\* \* \* \* \*

UNITED STATES PATENT AND TRADEMARK OFFICE
CERTIFICATE OF CORRECTION

| | | |
|---|---|---|
| PATENT NO. | : 12,272,862 B2 | Page 1 of 1 |
| APPLICATION NO. | : 18/519821 | |
| DATED | : April 8, 2025 | |
| INVENTOR(S) | : Cho et al. | |

It is certified that error appears in the above-identified patent and that said Letters Patent is hereby corrected as shown below:

In the Claims

In Column 16, Line 1, Claim 13:
Change "depositing a first dielectric layer over a first surface of the"
To --depositing a first dielectric layer over the first surface of the--

Signed and Sealed this
Twenty-fourth Day of June, 2025

Coke Morgan Stewart
*Acting Director of the United States Patent and Trademark Office*